United States Patent [19]
Ohyama et al.

[11] Patent Number: 5,892,779
[45] Date of Patent: Apr. 6, 1999

[54] SCAN TEST APPARATUS

[75] Inventors: Yasuji Ohyama; Hironobu Niijima, both of Nerima-ku; Mitsuaki Ishikawa, Kita-ku; Tadashi Kamada, Setagaya-ku, all of Japan

[73] Assignees: Advantest Corporation, Tokyo; Kabushiki Kaisha Toshiba, Kanagawa, both of Japan

[21] Appl. No.: 759,003

[22] Filed: Dec. 2, 1996

[30] Foreign Application Priority Data

Dec. 5, 1995 [JP] Japan ................................. 7-316630

[51] Int. Cl.$^6$ ..................................................... G01R 31/28

[52] U.S. Cl. ..................................... 371/27.1; 395/183.06

[58] Field of Search ........................ 371/27, 21.6, 22.31, 371/22.6, 40.3, 27.1, 22.5, 25.1; 395/182.06, 183.01, 183.09, 183.13, 183.21, 185.01, 183.06, 183.14; 364/488, 489, 490

[56] References Cited

U.S. PATENT DOCUMENTS

| 5,303,246 | 4/1994 | Anderson et al. | 371/22.3 |
|---|---|---|---|
| 5,513,188 | 4/1996 | Parker et al. | 371/22.3 |
| 5,544,173 | 8/1996 | Meltzer | 371/22.3 |
| 5,544,308 | 8/1996 | Giordano et al. | 395/183.02 |
| 5,550,841 | 8/1996 | O'Brien | 371/22.1 |
| 5,630,048 | 5/1997 | La Joie et al. | 395/183.01 |
| 5,663,967 | 9/1997 | Lindberg et al. | 371/26 |
| 5,691,991 | 11/1997 | Kessler et al. | 371/22.3 |

*Primary Examiner*—Robert W. Beausoliel, Jr.
*Assistant Examiner*—Nadeem Iqbal
*Attorney, Agent, or Firm*—Kanesaka & Takeuchi

[57] ABSTRACT

A scan test apparatus for operating a test unit according to a test pattern and outputs address information of the test pattern at which a fail takes place, which includes a memory unit for holding circuit information in which scan flip-flops are written at corresponding addresses and a control unit for outputting, in addition to the address information, a scan flip-flop name from the memory unit corresponding to the address information.

4 Claims, 7 Drawing Sheets

SCAN TEST APPARATUS

BACKGROUND OF THE INVENTION

1. Field of the Invention

The present invention relates to scan test apparatus for performing scan test of devices.

2. Description of the Related Art

Recently, it is difficult to perform operation test of device mounted boards or mounted devices because of high functions or high density mounting of devices. Especially, in-circuit testers are prohibitively expensive to do operation analysis. Scan test systems are used for scan designed devices such as those according to the architecture under IEEE Standard 1149.1a. They are able to check the operation of a specified device or each device by forming a scan pass in which scan flip-flops on the devices are connected with a scan chain to output from the connector output defect analysis information (hereinafter "scan data log").

In the conventional scan test systems, the contents of a scan data log are data outputted in response to a test pattern, which indicate the failure position with the address at which the failure takes place.

The above conventional scan test systems provide only data for the test pattern and the failure occurrence address and the following problems:

The information desired to obtain from the scan test includes:

(1) the scan chain where a failure takes place and (2) the scan flip-flop where a failure takes place. These pieces of information have been determined by using the test pattern, the historical information which shows how the test pattern is inputted, and the failure occurrence address. However, this operation requires large amounts of work and time.

The circuit design of devices includes computer simulation of the operation of designed circuits, scan test of the manufactured devices, and comparison between these results.

The computer simulation usually shows transitional conditions of the devices along the time axis. The conventional scan test systems provide only the failure occurrence address so that it is necessary to compare data at different parameters such as "address" and "time". Consequently, it is difficult to compare waveforms at a time, making failure analysis difficult.

SUMMARY OF THE INVENTION

The present invention is made so as to solve these problems. Accordingly, it is an object of the invention to provide a scan test apparatus capable of performing failure analysis of scan test results at high speed.

According to an aspect of the invention there is provided a scan test apparatus for operating a test unit according to a test pattern, which includes a memory unit for holding circuit information in which scan flip-flop names are written at corresponding addresses; and a control unit for outputting as test results address information at a time when a fail takes place and a scan flip-flop name from the memory unit corresponding to the address information.

According to another aspect of the invention there is provided a scan test apparatus for operating a test unit according to a test pattern, which includes a memory unit for holding circuit information in which scan chain names are written at corresponding addresses; and a control unit for outputting as test results address information at a time when a fail takes place and a scan chain name from the memory unit corresponding to the address information.

According to still another aspect of the invention there is provided a scan test apparatus for operating a test unit according to a test pattern, which includes a memory unit for holding an address area of address information outputted when a fail takes place; and a control unit for outputting as test results only address information within the address area stored in the memory unit.

According to yet another aspect of the invention there is provided a scan test apparatus for operating a test unit according to a test pattern, which includes a memory unit for holding time data at which a fail takes place; a computing unit for computing a time period from the time data based on an execution order of the test pattern, a test rate at which the test pattern is executed, and address information and storing the time period in the memory unit along with the address information; and a control unit for outputting as test results the information address and the time period from the memory unit corresponding the address information.

The scan test apparatus according to the invention outputs the scan flip-flop name, scan chain name, or fail occurrence time along with the address information.

Where the output address area is restricted, the scan test apparatus outputs the test results only within the necessary area, thereby increasing the analysis efficiency.

DESCRIPTION OF THE PREFERRED EMBODIMENT

Figure 1:
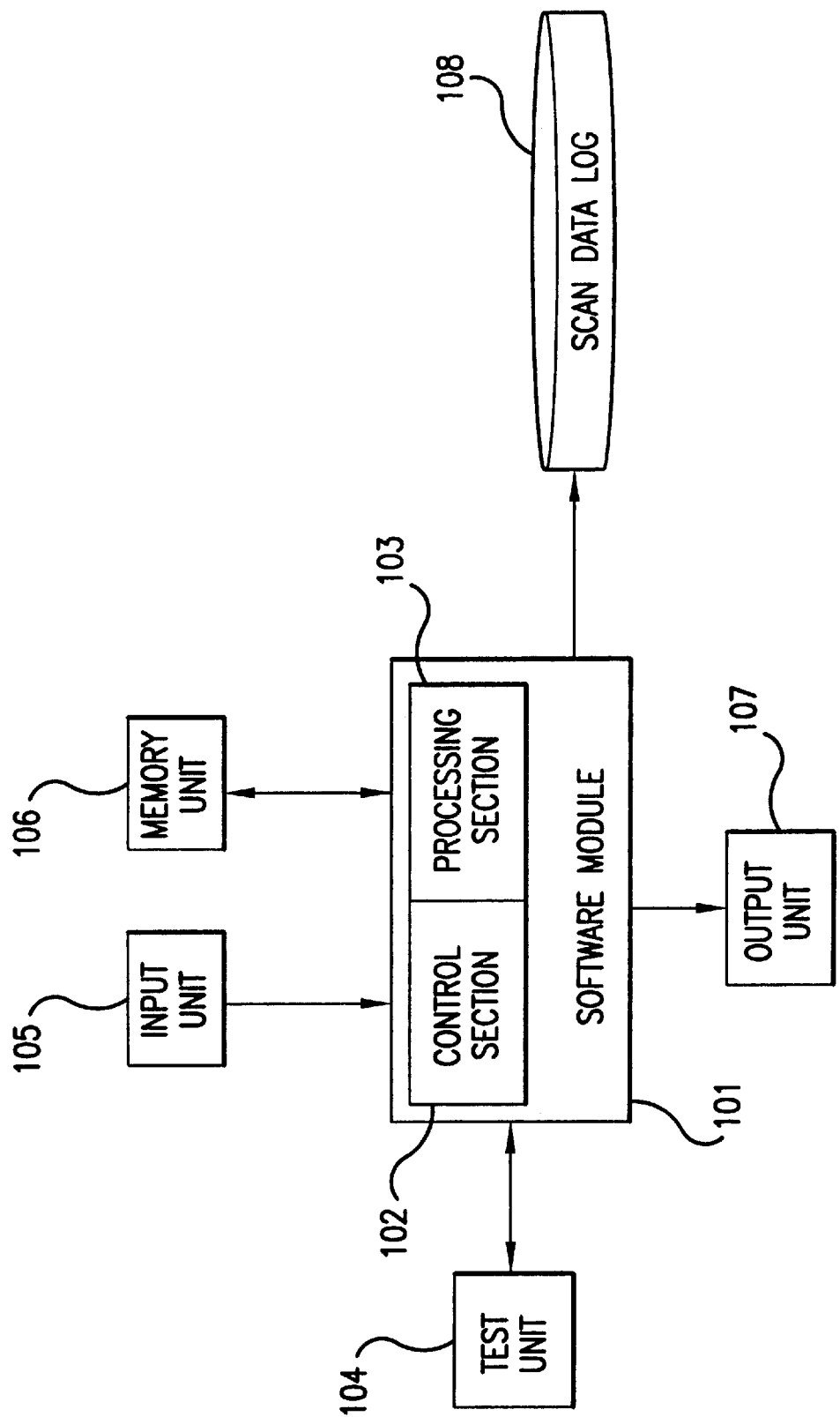
FIG. 1 is a block diagram of a scan test apparatus according to an embodiment of the invention.

In FIG. 1, a scan test apparatus includes a fetch area information fetch module 302; software module 101 consisting of a control section 102 and a processing section 103, a test unit 104, an input unit 105, a memory unit 106, an output unit 107, and a scan data log 108.

The control section 102 of the software module 101 starts a test program and a test pattern for the test unit 104 or reads fail data to control the test unit 104. The processing section 103 makes a scan data log 108 in response to the contents of the input unit 105, the contents of the memory unit 106, and the operation results of the test unit 104 and outputs the results to the output unit 107 such as a display or printer.

Figure 2:
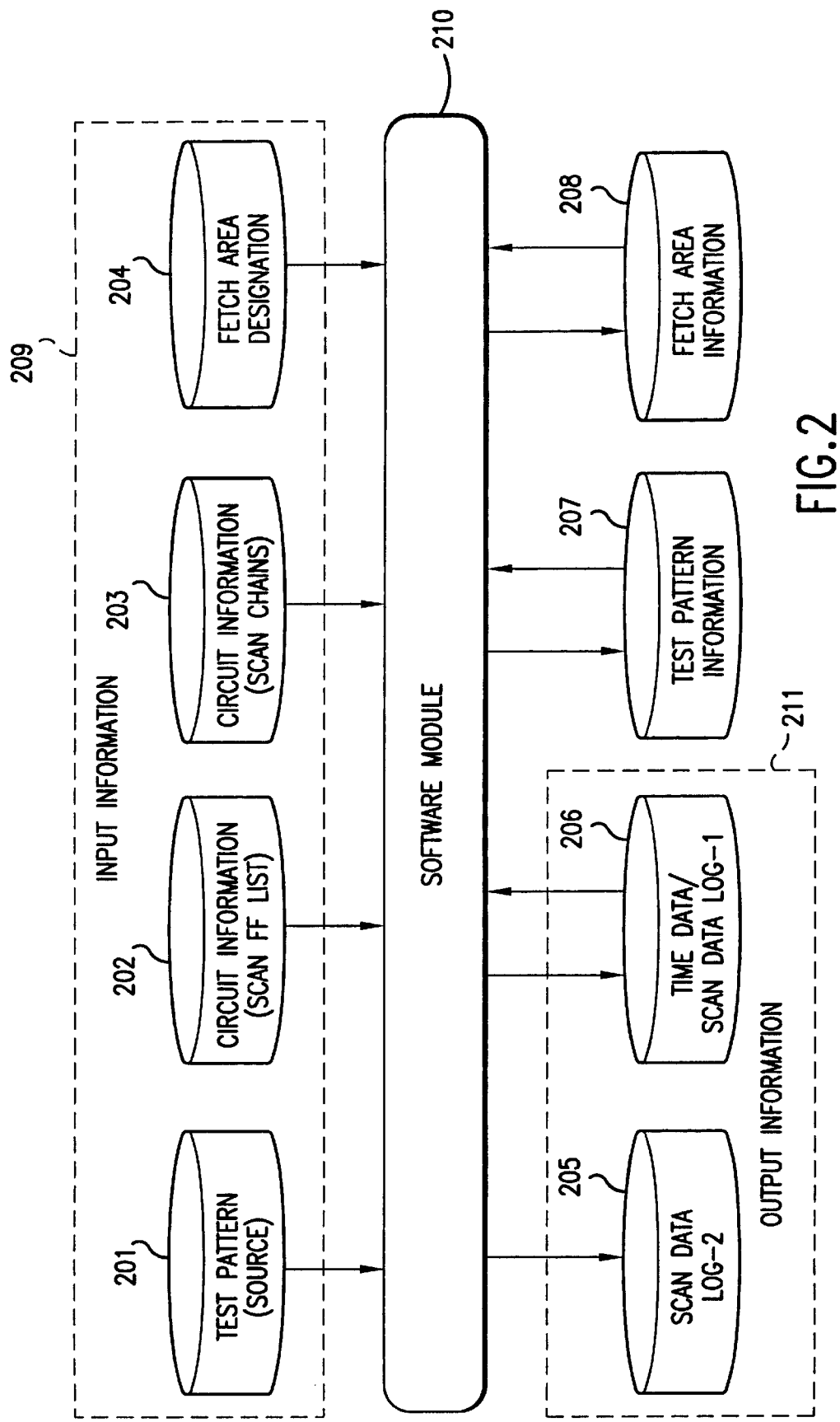
FIG. 2 is a diagram showing information flows in the apparatus of FIG. 1.

FIG. 2 shows respective information flows such as input information to the input unit 105, output information or the scan data log 108, and the memory contents of the memory unit 106.

The information fed to the input unit 105 includes a test pattern 201 for the test unit 104, circuit information 202 in which scan flip-flop names are written at corresponding addresses, circuit information 203 in which scan chains are written at corresponding addresses, and a fetch area designation 204 to indicate a fetch area of scan results. The contents of the memory unit 106 include test pattern information 207 and fetch area information 208 which are input contents of the test pattern 201 and the fetch area designation 204, respectively. These memory contents are updated according to the input contents. The scan data log 108, which is made on the basis of the test results of the test unit 104 for respective input information, consists of a scan data log-1 206-1 and a time data 206-2 (FIG. 3), and a scan data log-2 205 in which new information is added to the scan data log-1.

Figure 3:
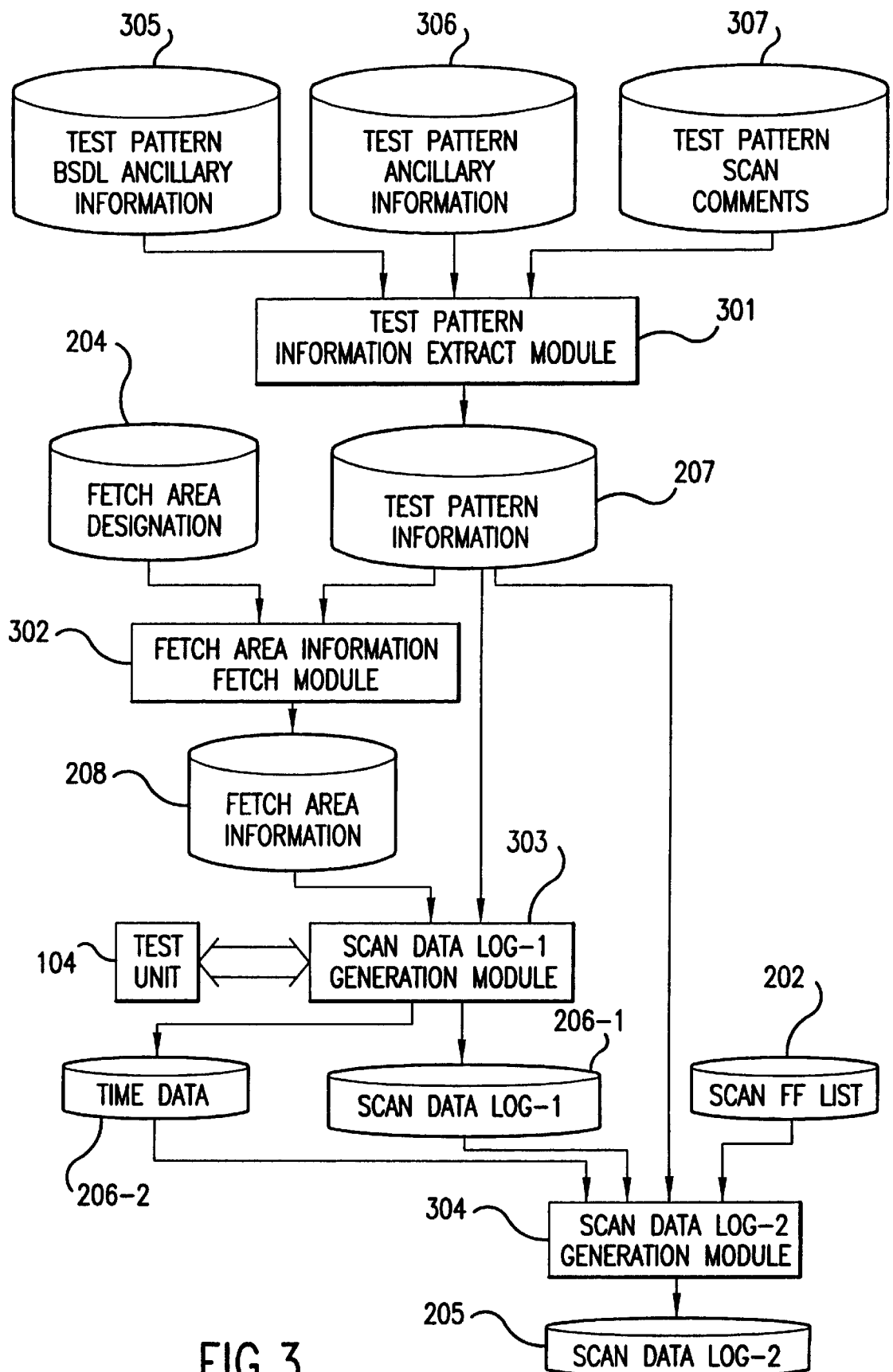
FIG. 3 is a diagram showing the structure of a software module 101 shown in FIG. 1.

The software module 101 will be described with reference to FIG. 3.

The software module 101 consists of four modules; i.e., a test pattern information extract module 301, an fetch area information fetch module 302, a scan data log-1 generation module 303, and a scan data log-2 generation module 304. The operation of each module will be described below.

Test Pattern Information Extract Module 301

The test pattern information extract module 301 reads the test pattern 201 (FIG. 2) and circuit information 203 (FIG. 2) about scan chains to generate test pattern information 207. As the circuit information 203 about scan chains, one of the following is fed.

(1) circuit information written on the basis of BSDL and ancillary circuit information about time and the device terminal used for test with the test pattern necessary for the scan analysis according to the invention;

(2) only ancillary circuit information about time and the device terminal used for test with the test pattern necessary for the scan analysis according to the invention; and (3) circuit information consisting of only test patterns in which information about time and the device terminal used for test with the test pattern necessary for the scan analysis according to the invention is written as scan comments.

The test pattern information 207 consists of address information of the test pattern, the test rate switch timing information, pattern count information, and the corresponding information for test patterns and the scan chains. The test pattern information generated here is essential for other modules and serves as reference for other processes.

Fetch Area Information Fetch Module 302

The fetch area information fetch module 302 processes fail fetch designation in a given area in the test pattern. It is noted that the designation is made with the scan chain name. Moreover, designation at a predetermined position in the scan chain is possible. Normally, such designation is impossible because the test pattern has no information about the scan chain. However, the test pattern information generated above has the corresponding information for the test pattern and the scan chain, thus making such a designation possible.

The fetch area information 208 generated here is address information of the test pattern to which the scan chain or position information fed as the fetch area designation 204 (FIG. 2) are converted in order to increase the efficiency of control of the test unit 104 (FIG. 1) in a scan data log-1 generation module 303 described hereinafter.

Scan Data Log-1 Generation Module 303

The scan data log-1 generation module 303 controls the test unit 104 in the area indicated by the fetch area information 208 to execute the test program, receives the results or fail data to identify the scan flip-flop, and generates the scan data log-1 206-1 and the time data 206-2. The fail data obtained by the test is expressed in an address of the test pattern. This data is used to identify the scan chain name and the scan flip-flop by making reference to the corresponding information for the test pattern and the scan chain of the test pattern information 207.

In order to fetch all fail data, the memory contents of a fail memory for storing fail data of the test unit are transferred to another memory unit sequentially at every time when the test pattern is executed so that the fetch area of fail data is gradually shifted. All the fail data thus obtained is read to identify the scan flip-flop for generation of the scan data log-1. The scan data log-1 is generated while the test unit is controlled so that the minimum set of the scan data log is made in order to avoid exclusive use of the test unit. The identification of the scan flip-flop is made in the module which reads the fail data from the test unit. At the same time, the basic data of time necessary for calculation of the time information is made.

Scan Data Log-2 Generation Module 304

The scan data log-2 generation module 304 is a module in which more information is attached to the scan data log-1. The attached information includes address information of the test pattern, time information, and names of scan flip-flops and scan cell logic. They are made and attached by making reference to the scan data log-1 206-1, the time data 206-2, and the scan flip-flop list 202. The time data 206-2 includes the test pattern execution order and the test rate at which the test pattern is executed. This makes it possible to compute the time period since the fail data is generated.

When a comparison is made between the device defect analysis and the logic simulation, there is no parameter common to both the methods because the simulation is made on the basis of time while the test unit has only address information of the test pattern. In this embodiment, time information is added to indicate the time when fail data is generated, thereby solving this problem. The addition of scan flip-flop or cell names makes it possible to exchange directly defect information when an external third analyzing unit receives these names, thereby improving the defect analysis efficiency.

The operation of the modules will be described below. In FIGS. 4–7, the operations of the test pattern information extract module 301, the fetch area information fetch module 302, the scan data log-1 generation module 303, and the scan data log-2 generation module 304 are shown in the flowcharts.

Figure 4:
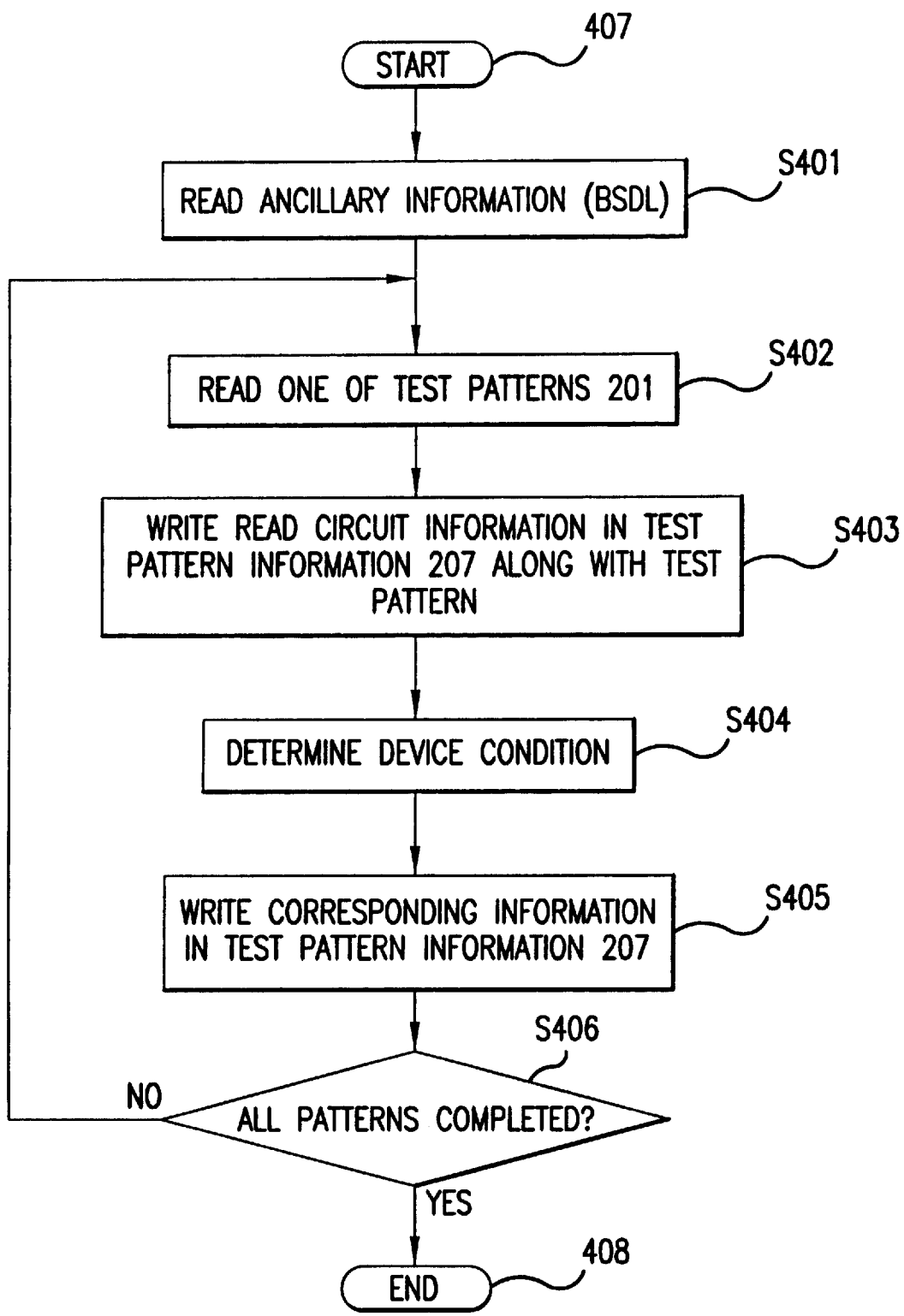
FIG. 4 is a flowchart showing the operation of a test pattern information extraction module 301.

First of all, the operation of the test pattern information extract module 301 is described with reference to FIG. 4.

As described above, the circuit information fed to the test pattern information extract module 301 is circuit information written on the basis of BSDL, ancillary circuit information, or information written in the test pattern as scan comments.

Where circuit information is provided as BSDL or ancillary information, the ancillary information is read and analyzed (Step S401). Then, the test pattern is read step by step. Where circuit information is provided as scan comments, it is analyzed here (Step S402) address information of the test pattern, the test rate switch timing information, and the pattern count information is written as test pattern information 207 (Step S403).

The written test pattern is analyzed to determine the current status of the device. Where BSDL is provided as circuit information, the test pattern is tracked according to the TAP controller status transition diagram (Step S404). Then, the corresponding information for address information and scan chain of the test pattern is generated and written as test pattern information 207 (Step S405). Then, the completion of process at Steps S402–405 for all of the test pattern 201 is checked. If it is not completed, the process returns to Step S402 to repeat the respective operations (Step S406).

Figure 5:
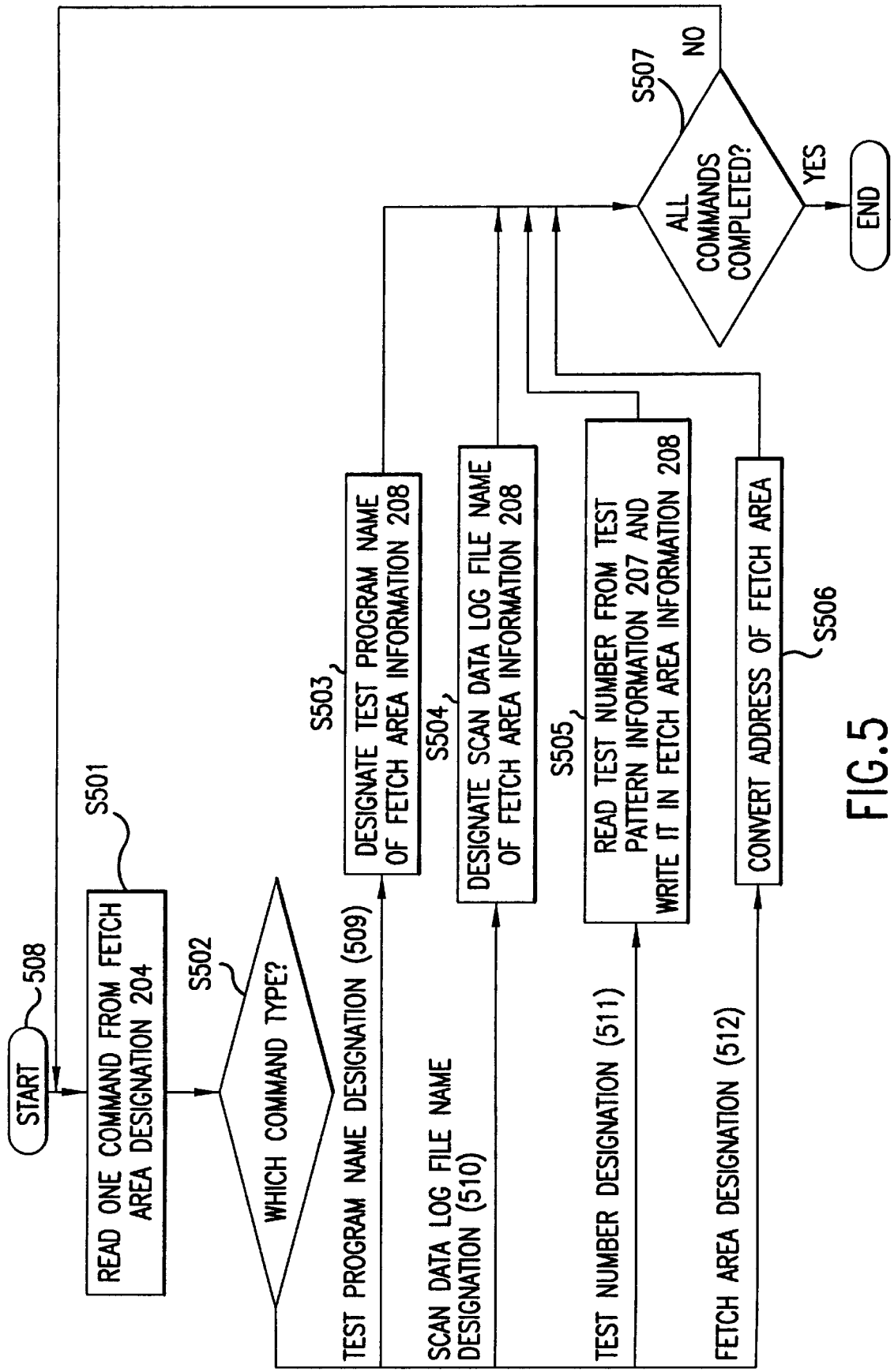
FIG. 5 is a flowchart showing the operation of a fetch area information fetch module 302.

The operation of the fetch area information fetch module 302 will be described with reference to FIG. 5.

The fetch area designation 204 requires the following four pieces of information:

(1) the name of a program to be executed;
(2) the file name of a scan data log-1 to be generated;
(3) the test number within a test program; and
(4) the fetch area for the fail data.

When the fetch area information fetch module 302 is started, one command is read from the fetch area designation 204 (Step S501), and the type of the command is checked (Step S502).

Where the read command is designation of the name of a test program, the name of the read test program is designated as the name of a test program for the fetch area information 208 (Step S503).

Where the read command is designation of the name of a scan data log, the name of the read scan data log is designated as the name of a scan data log for the fetch area information 208 (Step S504).

Where the read command is designation of the test number, the test pattern information file stored in the test pattern information 207 corresponding to the read test number is read and written in the fetch area information 208 (Step S505).

Where the read command is designation of the fetch area, the fetch contents or the scan chain name or the position information within the scan chain are converted to address information of the test pattern (Step S506).

Then, completion of the operation on all of the fetch area command 204 is checked. If it is not completed, the process returns to Step S501 to repeat the above operations (Step S507).

Figure 6:
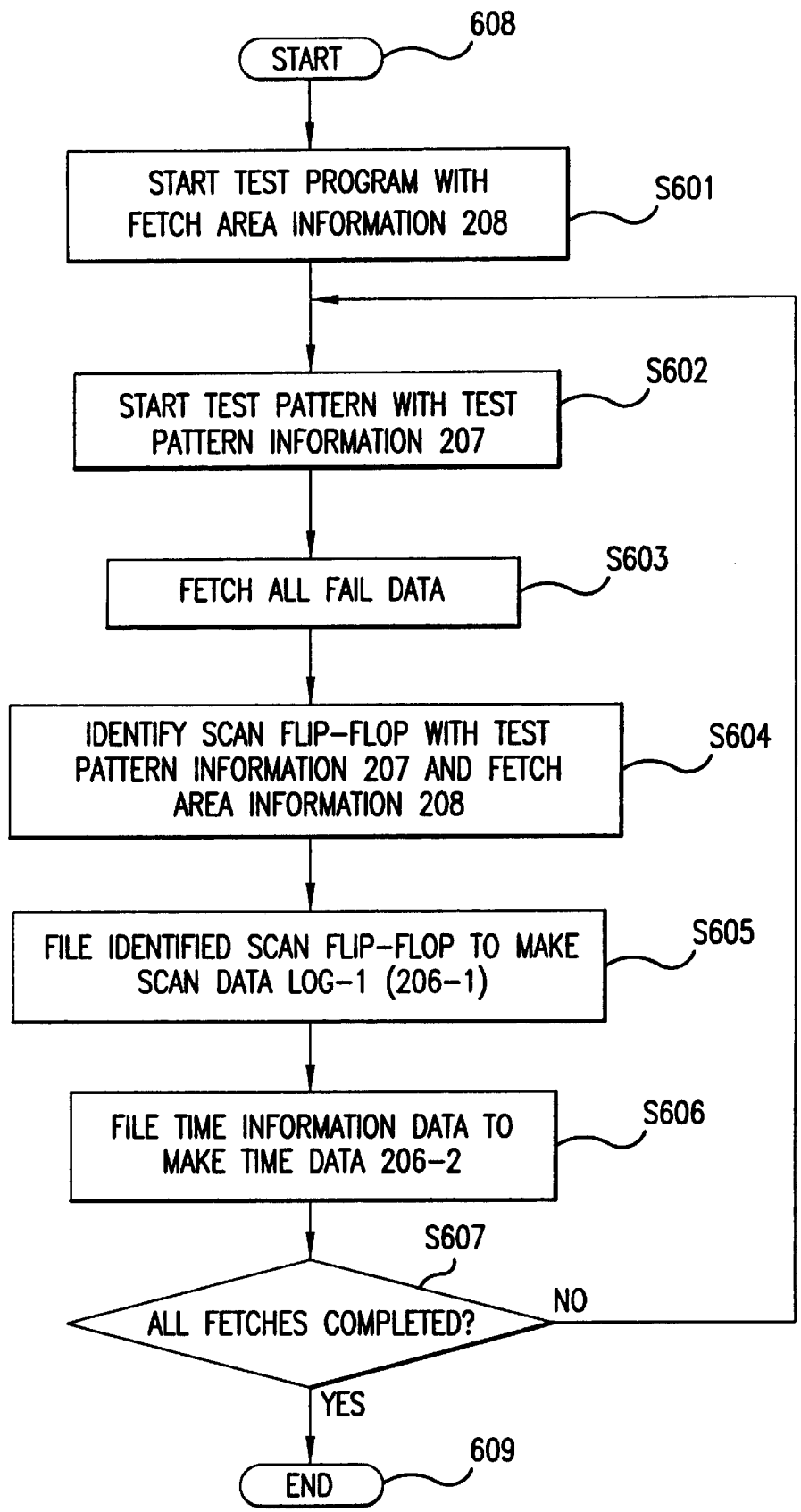
FIG. 6 is a flowchart showing the operation of the scan data log-1 generation module 303.

The operation of the scan data log-1 generation module 303 will be described with reference to FIG. 6.

Upon operation, a test program is read from the fetch area information 208 for execution. Where the function test by the test program is executed, setting is made to move the control to this module (Step S601). After the control is moved to this module, setting is made so as to retrieve the target fail data into the test unit, and the test pattern by the test pattern information 207 is started (Step S602).

Whether the acquired fail data falls within the fetch designation area is determined. If the data is to be fetched, it is temporarily stored in the memory unit 106 (FIG. 1) for feeding to the scan data log. This operation is repeated until all fail data within the fetch designation area is acquired (Step S603).

Then, the scan flip-flop is identified on the basis of the address information of the fetched fail data considering the test pattern information (Step S604). Then, information about the identified scan flip-flop is filed as the scan data log-1 206-1 (Step S605). Then, all data about time, such as test patterns and test rates, is filed to generate the time data 206-2 (Step S606).

Then, whether all fail data is fetched is checked. If it is not completed, the process returns to Step S602 to repeat the above operations (Step S607).

Figure 7:
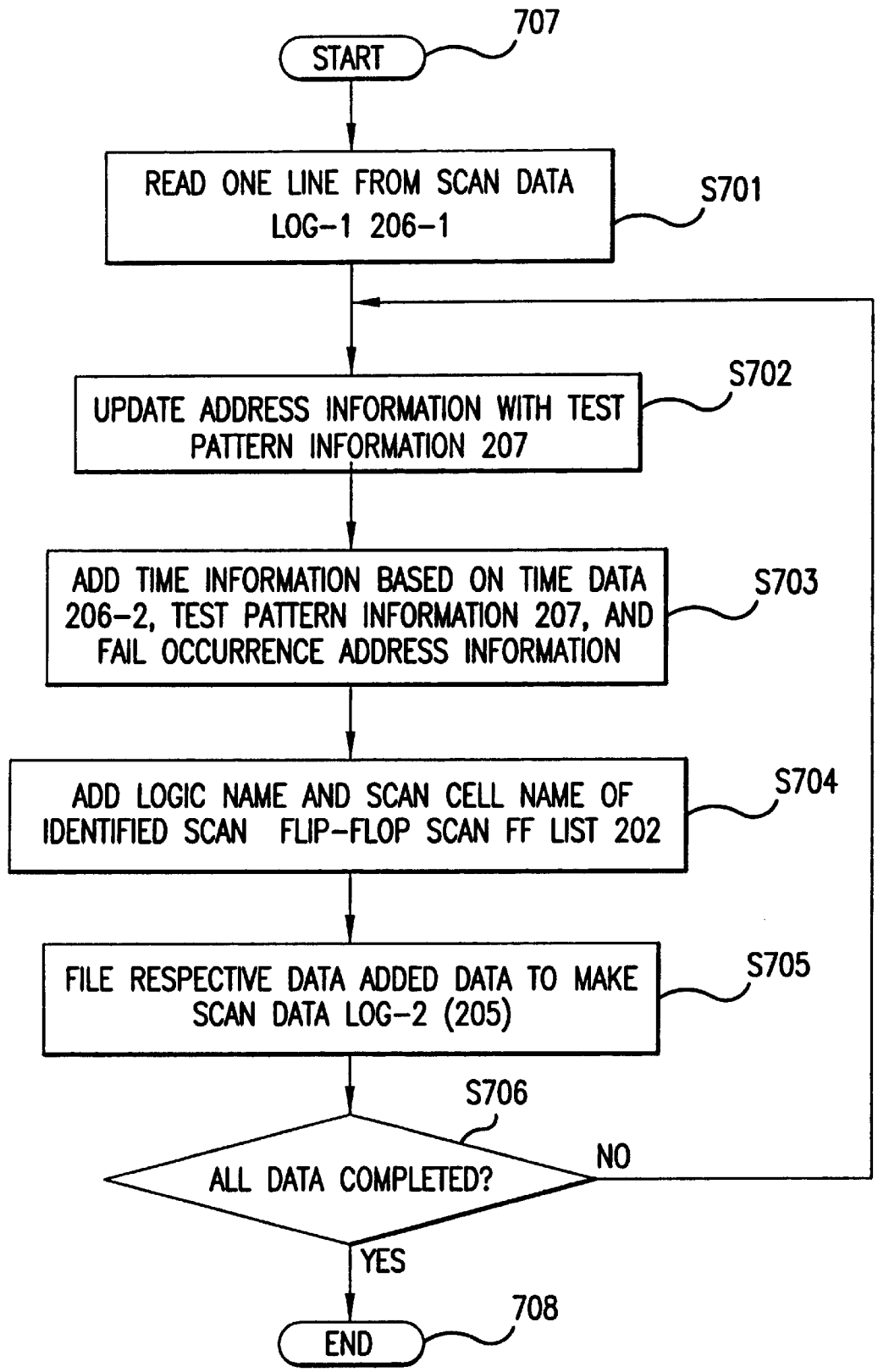
FIG. 7 is a flowchart showing the operation of the scan data log-2 generation module 304.

The operation of the scan data log-2 generation module 304 will be described with reference to FIG. 7.

The scan data log-2 is generated by adding new information to the scan data log-1. Upon operation, it reads a line from the scan data log-1 206-1 (Step S701). Then, the fail data address information of the read scan data log-1 206-1 is updated with the address information 207. This is necessary because the test pattern to be executed varies with the test unit 104.

Then, the fail occurrence time is computed based on the time data 206-2, the fail data address information and the test pattern information 207 and added to the test pattern information 207 as time information (Step S703). Then, the logic name and the scan cell name of the identified flip-flop are added by making reference to the scan flip-flop list 202 (Step S704). The added information is then filed to generate a scan data log-2 (Step S705).

Then, completion of the above operation on all the data in the scan data log-1 is checked. If it is not completed, the process returns to Step S702 to repeat the above operations (Step S706).

The apparatus according to the invention produces the following effects:

Where the address information at which a fail takes place and the scan flip-flop name stored in the memory unit corresponding to the address information are outputted, the scan flip-flop name, scan chain name, and fail occurrence time, which have been identified by analyzing the test results, are outputted along with address information so that the test analysis is speeded up.

Where only address information within the addresses stored in the memory unit is outputted as test results, the address area is limited so as to output the results in only the necessary area, thereby increasing the efficiency of the test and analysis.

What is claimed is:

1. A scan tester for operating a test unit according to a test pattern, comprising:

memory means for holding circuit information in which scan flip-flop names are written at corresponding addresses; and control means for outputting as test results address information at a time when a fail takes place and a scan flip-flop name from said memory means corresponding to said address information, said control means including a software module which comprises:

a test pattern information extract module for generating test pattern information from said test pattern and scan chain circuit information;

a fetch area information fetch module for generating test pattern address information from said test pattern information and scan chain name and position information inputted from outside;

a first scan datalog generation module responsive to said test pattern information and said test pastern address information to operate said test unit for executing a test program and receive fail data for identifying and filing a scan chain name and a scan flip-flop to generate a first scan datalog and time data; and a second scan datalog generation module for calculating from said first scan datalog, said test pattern information, and said time data a time when said fail takes place to generate time information and identifying and filing together with said time information a flip-flop name and a scan name with reference to a scan flip-flop list inputted from outside.

2. A scan tester for operating a test unit according to a test pattern, comprising:

memory means for holding circuit information in which scan chain names are written at corresponding addresses; and control means for outputting as test results address information at a time when a fail takes place and a scan chain name from said memory means corresponding to said address information, said control means including a software module which comprises:

a test pattern information extract module for generating test pattern information from for said test pattern and scan chain circuit information;

a fetch area information fetch module for generating test pattern address information from said test pattern information and scan chain name and position information inputted from outside;

a first scan datalog generation module responsive to said test pattern information and said test pastern address information to operate said test unit for executing a test program and receive fail data for identifying and filing a scan chain name and a scan flip-flop to generate a first scan datalog and time data; and a second scan datalog generation module for calculating from said first scan datalog, said test pattern information, and said time data a time when said fail takes place and generate time information and identifying and filing together with said time information a flip-flop name and a scan name with reference to a scan flip-flop list inputted from outside.

3. A scan tester for operating a test unit according to a test pattern, comprising:

memory means for holding an address area of address information outputted when a fail takes place; and control means for outputting as test results only address information within said address area stored in said memory means, said control means including a software module which comprises:

a test pattern information extract module for generating test pattern information from said test pattern and scan chain circuit information;

a fetch area information fetch module for generating test pattern address information from said test pattern information and scan chain name and position information inputted from outside;

a first scan datalog generation module responsive to said test pattern information and said test pattern address information to operate said test unit for executing a test program and receive fail data for identifying and filing a scan chain name and a scan flip-flop to generate a first scan datalog and time data; and a second scan datalog generation module for calculating from said first scan datalog, said test pattern information, and said time data a time when said fail takes place to generate time information and identifying and filing together with said time information a flip-flop name and a scan name with reference to a scan flip-flop list inputted from outside.

4. A scan tester for operating a test unit according to a test pattern, comprising:

memory means for holding time data when a fail takes place;

control means for computing a time period from said time data based on an execution order of said test pattern, a test rate at which said test pattern is executed, and address information and storing said time period in said memory means along with said address information and outputting as test results said information address and said time period from said memory means corresponding to said address information, said control means including a software module which comprises:

a test pattern information extract module for generating test pattern information from said circuit information for said test pattern and a scan chain;

a fetch area information fetch module for generating test pattern address information from said test pattern information and scan chain name and position information inputted from outside;

a first scan datalog generation module responsive to said test pattern information and said test pattern address information to operate said test unit for executing a test program and receive fail data for identifying and filing a scan chain name and a scan flip-flop to generate a first scan datalog and time data; and a second scan datalog generation module for calculating from said first scan datalog, said test pattern information, and said time data a time when said fail takes place and generate time information and identifying and filing together with said time information a flip-flop name and a scan name with reference to a scan flip-flop list inputted from outside.

* * * * *